US009917567B2

(12) United States Patent
Bradley et al.

(10) Patent No.: US 9,917,567 B2
(45) Date of Patent: Mar. 13, 2018

(54) BULK ACOUSTIC RESONATOR COMPRISING ALUMINUM SCANDIUM NITRIDE

(71) Applicant: Avago Technologies General IP (Singapore) Pte. Ltd., Singapore (SG)

(72) Inventors: Paul Bradley, Los Altos, CA (US); Alexandre Shirakawa, San Jose, CA (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 113 days.

(21) Appl. No.: 14/843,943

(22) Filed: Sep. 2, 2015

(65) Prior Publication Data
US 2015/0381144 A1   Dec. 31, 2015

Related U.S. Application Data

(63) Continuation-in-part of application No. 13/112,407, filed on May 20, 2011, now abandoned, and a
(Continued)

(51) Int. Cl.
*H03H 9/54* (2006.01)
*H03H 9/15* (2006.01)
(Continued)

(52) U.S. Cl.
CPC .......... *H03H 9/02015* (2013.01); *H03H 3/02* (2013.01); *H03H 9/1014* (2013.01);
(Continued)

(58) Field of Classification Search
CPC .... H03H 3/02; H03H 9/02015; H03H 9/0211; H03H 9/1014; H03H 9/132; H03H 9/9173; H03H 9/605; H03H 9/685
(Continued)

(56) References Cited

U.S. PATENT DOCUMENTS 5,587,620 A   12/1996   Ruby et al.
5,872,493 A   2/1999    Ella
(Continued)

FOREIGN PATENT DOCUMENTS

DE   10150253       4/2003
DE   102006032950   1/2008

OTHER PUBLICATIONS

K. Umeda et al.; "Piezoelectric Properties of ScAlN Thin Films for Piezo-MEMS Devices"; Published in 2013 IEEE 26th International Conference on Micro Electro Mechanical Systems (MEMS), Date of Conference Jan. 20-24, 2013, 4 pages plus 1 page IEEE Xplore Abstract.*

(Continued)

*Primary Examiner* — Barbara Summons

(57) ABSTRACT

A ladder filter includes a plurality of series resonators and a plurality of shunt resonators connected between an input port and an output port. At least one of the series or shunt resonators include a bulk acoustic wave (BAW) resonator structure, which includes: a first electrode disposed over a substrate; an air cavity located in the substrate and below the first electrode; a piezoelectric layer disposed over the first electrode and comprising aluminum scandium nitride, the piezoelectric layer having a thickness in a range of approximately 1.0 microns to approximately 1.5 microns; and a second electrode disposed over the piezoelectric layer. The BAW resonator structure has an area, and the area is less than an area of a comparable BAW resonator structure comprising identical layers and materials except for an undoped aluminum nitride piezoelectric layer.

17 Claims, 6 Drawing Sheets

Related U.S. Application Data continuation-in-part of application No. 13/778,593, filed on Feb. 27, 2013, now Pat. No. 9,154,111.

(51) Int. Cl.
  *H03H 9/02* (2006.01)
  *H03H 9/56* (2006.01)
  *H03H 9/10* (2006.01)
  *H03H 9/17* (2006.01)
  *H03H 3/02* (2006.01)
  *H03H 9/13* (2006.01)
  *H03H 9/60* (2006.01)

(52) U.S. Cl.
  CPC ............ *H03H 9/132* (2013.01); *H03H 9/173* (2013.01); *H03H 9/568* (2013.01); *H03H 9/605* (2013.01); *H03H 9/0211* (2013.01)

(58) Field of Classification Search
  USPC .................................................. 333/187, 189
  See application file for complete search history.

(56) References Cited

U.S. PATENT DOCUMENTS

| | | | |
|---|---|---|---|
| 5,873,153 A | 2/1999 | Ruby et al. | |
| 5,910,756 A | 6/1999 | Ella | |
| 6,060,818 A | 5/2000 | Ruby et al. | |
| 6,107,721 A | 8/2000 | Lakin | |
| 6,262,637 B1 | 7/2001 | Bradley et al. | |
| 6,384,697 B1 | 5/2002 | Ruby | |
| 6,452,310 B1* | 9/2002 | Panasik ................. | H03H 9/175 310/334 |
| 6,466,105 B1 | 10/2002 | Lobl et al. | |
| 6,507,983 B1 | 1/2003 | Ruby et al. | |
| 6,583,688 B2 | 6/2003 | Klee et al. | |
| 6,828,713 B2 | 12/2004 | Bradley et al. | |
| 6,936,837 B2 | 8/2005 | Yamada et al. | |
| 7,180,224 B2* | 2/2007 | Bouche ................. | H03H 9/586 310/312 |
| 7,280,007 B2 | 10/2007 | Feng et al. | |
| 7,345,410 B2 | 3/2008 | Grannen et al. | |
| 7,358,831 B2 | 4/2008 | Larson et al. | |
| 7,388,454 B2 | 6/2008 | Ruby et al. | |
| 7,463,118 B2 | 12/2008 | Jacobsen | |
| 7,466,213 B2 | 12/2008 | Lobl et al. | |
| 7,561,009 B2 | 7/2009 | Larson, III et al. | |
| 7,629,865 B2 | 12/2009 | Ruby | |
| 7,684,109 B2 | 3/2010 | Godshalk et al. | |
| 7,714,684 B2 | 5/2010 | Ruby et al. | |
| 7,758,979 B2 | 7/2010 | Akiyama et al. | |
| 7,791,434 B2 | 9/2010 | Fazzio et al. | |
| 7,889,024 B2 | 2/2011 | Bradley et al. | |
| 7,978,025 B2* | 7/2011 | Yokoyama ................ | H03H 3/04 310/322 |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,330,325 B1 | 12/2012 | Burak et al. | |
| 8,902,023 B2 | 12/2014 | Choy et al. | |
| 8,922,302 B2 | 12/2014 | Ruby | |
| 9,154,111 B2* | 10/2015 | Bradley ............... | H03H 9/1007 |
| 9,455,681 B2* | 9/2016 | Feng .................. | H03H 9/02031 |
| 2003/0117236 A1* | 6/2003 | Barber ...................... | H03H 3/04 333/187 |
| 2005/0057117 A1 | 3/2005 | Nakatsuka et al. | |
| 2005/0168104 A1 | 8/2005 | Bouche et al. | |
| 2006/0164186 A1 | 7/2006 | Stoemmer et al. | |
| 2006/0202779 A1 | 9/2006 | Fazzio et al. | |
| 2007/0024395 A1 | 2/2007 | Motai | |
| 2007/0085632 A1 | 4/2007 | Larson, III et al. | |
| 2007/0205850 A1 | 9/2007 | Jamneala et al. | |
| 2007/0278469 A1 | 12/2007 | Marty et al. | |
| 2007/0279149 A1 | 12/2007 | Dal Molin | |
| 2008/0055020 A1 | 3/2008 | Handtmann et al. | |
| 2008/0079516 A1 | 4/2008 | Ruby et al. | |
| 2008/0169884 A1 | 7/2008 | Matsumoto et al. | |
| 2008/0204857 A1 | 8/2008 | Godshalk et al. | |
| 2008/0297278 A1 | 12/2008 | Handtmann et al. | |
| 2010/0052815 A1 | 3/2010 | Bradley et al. | |
| 2010/0327697 A1 | 12/2010 | Choy et al. | |
| 2010/0327994 A1 | 12/2010 | Choy et al. | |
| 2011/0180391 A1 | 7/2011 | Larson, III et al. | |
| 2011/0266925 A1 | 11/2011 | Ruby et al. | |
| 2012/0000766 A1* | 1/2012 | Teshigahara ........ | C23C 14/0036 204/192.15 |
| 2012/0050236 A1 | 3/2012 | Lo et al. | |
| 2012/0104900 A1 | 5/2012 | Nishihara et al. | |
| 2012/0107557 A1 | 5/2012 | Akiyama et al. | |
| 2012/0177816 A1 | 7/2012 | Larson, III et al. | |
| 2012/0218055 A1 | 8/2012 | Burak et al. | |
| 2012/0218056 A1 | 8/2012 | Burak et al. | |
| 2012/0218059 A1 | 8/2012 | Burak et al. | |
| 2012/0218060 A1 | 8/2012 | Burak et al. | |
| 2012/0248941 A1 | 10/2012 | Shirakawa et al. | |
| 2012/0280767 A1 | 11/2012 | Burak et al. | |
| 2012/0293278 A1 | 11/2012 | Burak et al. | |
| 2012/0326807 A1 | 12/2012 | Choy et al. | |
| 2013/0015747 A1 | 1/2013 | Ruby et al. | |
| 2013/0038408 A1 | 2/2013 | Burak et al. | |
| 2013/0049545 A1 | 2/2013 | Zou et al. | |
| 2013/0063226 A1 | 3/2013 | Burak et al. | |
| 2013/0106534 A1 | 5/2013 | Burak et al. | |
| 2013/0127300 A1* | 5/2013 | Umeda .................. | H01L 41/18 310/365 |
| 2013/0176086 A1 | 7/2013 | Bradley et al. | |
| 2014/0118089 A1 | 5/2014 | Bradley et al. | |
| 2014/0118090 A1 | 5/2014 | Grannen et al. | |
| 2014/0125202 A1 | 5/2014 | Choy et al. | |
| 2014/0125203 A1 | 5/2014 | Choy et al. | |
| 2014/0132117 A1 | 5/2014 | Larson, III | |
| 2014/0174908 A1 | 6/2014 | Feng et al. | |
| 2014/0246305 A1 | 9/2014 | Larson, III | |
| 2014/0292150 A1 | 10/2014 | Zou et al. | |
| 2014/0340172 A1 | 11/2014 | Bradley et al. | |
| 2014/0354109 A1 | 12/2014 | Grannen et al. | |
| 2015/0244347 A1* | 8/2015 | Feng .................. | H03H 9/02031 333/187 |

OTHER PUBLICATIONS

Moreira, et al. "Aluminum scandium nitride thin-film bulk acoustic resonators for wide band applications", Vacuum 86 (2011) 23-26.

Ranjan et al. "Strained Hexagonal ScN: A Material with Unusual Structural and Optical Properties," Physical Review Letters, Jun. 27, 2003, vol. 90, No. 25, The American Physical Society, USA, 4 pages.

Farrer et al., "Properties of hexagonal ScN versus wurtzite GaN and InN," Physical Review B, Nov. 20, 2002, vol. 66, No. 20, The American Physical Society, USA, 4 pages.

Constantin et al., "Composition-dependent structural properties in ScGaN alloy films: A combined experimental and theoretical study," Journal of Applied Physics, Dec. 16, 2005, vol. 98, No. 12, American Institute of Physics, USA, 8 pages.

Akiyama et al., "Enhancement of piezoelectric response in scandium aluminum nitride alloy thin films prepared by dual reactive cosputtering," Advanced Materials, 2009, vol. 21, pp. 593-596, Japan.

Suzuki et al., "Influence of shadowing effect on shear mode acoustic properties in the c-axis tilted AlN films," IEEE Ultrasonics Symposium (IUS), 2010, pp. 1478-1481.

Yanagitani et al., "Giant shear mode electromechanical coupling coefficient k12 in c-axis tilted ScAlN films," IEEE Ultrasonics Symposium (IUS), 2010, 4 pages.

Machine translation of DE10150253, published Apr. 30, 2003.

Machine translation of DE102006032950, published Jan. 24, 2008.

Co-pending U.S. Appl. No. 14/161,564, filed Jan. 22, 2014.

Co-pending U.S. Appl. No. 13/662,460, filed Oct. 27. 2012.

Co-pending U.S. Appl. No. 13/906,873, filed May 31, 2013.

(56) References Cited

OTHER PUBLICATIONS

Co-pending U.S. Appl. No. 14/191,771, filed Feb. 27, 2014.

* cited by examiner

BULK ACOUSTIC RESONATOR COMPRISING ALUMINUM SCANDIUM NITRIDE

CROSS-REFERENCE TO RELATED APPLICATIONS

This application is a continuation-in-part under 37 C.F.R. § 1.53(b) of U.S. patent application Ser. No. 13/112,407 filed on May 20, 2011 (now abandoned), and a continuation-in-part under 37 C.F.R. § 1.53(b) of U.S. Pat. No. 9,154,111 filed Feb. 27, 2013. Priority is claimed under 35 U.S.C. § 120 from U.S. patent application Ser. No. 13/112,407, and from U.S. Pat. No. 9,154,111. The entire disclosures of U.S. patent application Ser. No. 13/112,407, and U.S. Pat. No. 9,154,111 are specifically incorporated herein by reference.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), double bulk acoustic resonators (DBARs), and solidly mounted resonators (SMRs), to name but a few.

FIG. 1 is a block diagram illustrating an example of a band pass filter 100 formed by a plurality of acoustic resonators. Band pass filter 100 has a ladder circuit configuration that can be found, for instance in duplexer circuits associated with transmitters and receivers of mobile telephones.

Referring to FIG. 1, band pass filter 100 comprises a plurality of series resonators 105 and a plurality of shunt resonators 110 connected between an input port and an output port. Series resonators 105 have higher resonant frequencies than shunt resonators 110. Accordingly, they allow higher frequencies to pass through while shunting out lower frequencies.

FIG. 2 is a cross-sectional view illustrating an acoustic resonator 200 that can be included as one of series resonators 105 or shunt resonators 110 in the example of FIG. 1. In this example, BAW resonator 200 is an FBAR.

Referring to FIG. 2, acoustic resonator 200 comprises a substrate 205 and an acoustic stack 210 formed on substrate 205. Acoustic stack 210 comprises a piezoelectric layer 220 disposed between a first electrode 215 and a second electrode 225. Piezoelectric layer 220 comprises a piezoelectric material that converts electrical energy into mechanical movement and vice versa.

During typical operation, an electrical bias applied between first electrode 215 and second electrode 225 causes piezoelectric layer 220 to expand (or contract, depending on a phase of electrical signal) through the inverse piezoelectric effect. The expansion (or contraction) of piezoelectric layer 220 produces electric charge through the direct piezoelectric effect, which is then presented to the electrodes. Where the frequency of the electrical signal and the natural mechanical resonance frequency of acoustic stack 210 are close to each other, an electromechanical resonant state occurs resulting in significant mechanical displacements of particles comprising acoustic stack 210 and significant modification of electrical signal at electrodes 215 and 225. This electrical response is a basis of signal filtering in band pass filter 100 of FIG. 1. Where the frequency of the electrical signal is far away from mechanical resonance frequency of the stack 210, the mechanical displacement of particles is negligible and so is the produced charge, thus resulting in a standard capacitor-like electrical response of the resonator 200.

An air cavity 230 is formed in substrate 205 to facilitate mechanical movement of acoustic stack 210. Air cavity 230 facilitates mechanical movement by creating acoustic isolation between acoustic stack 210 and substrate 205. This acoustic isolation prevents acoustic stack 210 from losing mechanical energy to substrate 230, which in turn prevents acoustic stack 210 from losing signal strength.

A microcap 235 is connected to acoustic stack 210 using wafer bonding technology. Microcap 235 can be formed, for instance, by etching a cavity in a silicon wafer and placing the cavity over acoustic stack 210. It can also be formed, for instance, by attaching an annular gasket to substrate 205 and placing silicon over the annular gasket. Microcap 235 forms an air cavity 245 over acoustic stack 210 and allows for unobstructed movement of acoustic stack 210. It also hermetically seals acoustic resonator 200 to prevent damage from environmental factors such as humidity.

In addition to the features shown in FIG. 2, acoustic resonator 200 typically comprises electrical contact pads connected to first and second electrodes 215 and 225. The electrical contact pads extend outward from the sides of acoustic resonator 200 to transmit input and output signals to first and second electrodes 215 and 225, respectively.

Significant design considerations for acoustic resonators include, among other things, cost, chip area, and response characteristics. There are various factors that affect each of these considerations. For instance, the cost of a resonator typically varies according to the materials and processes used in its manufacture. The chip area, meanwhile, tends to vary according to the lateral width of the acoustic stack and associated components, such as the microcap and contact pads. In general, the lateral width of the acoustic stack varies according to its passband, with lower frequency resonators occupying more space than higher frequency resonators. The response characteristics of an acoustic resonator are defined by various parameters, such as an electromechanical coupling coefficient ($k_t^2$) and a quality (Q) factor. The electromechanical coupling coefficient $k_t^2$ indicates the efficiency of energy transfer between electrodes and the piezoelectric materials. This coefficient influences insertion loss and bandwidth of the filter 100. The Q factor affects roll-off of the filter 100, and it varies according to various material properties of the acoustic resonator 200, such as a series resistance Rs and a parallel resistance Rp, which correspond to various heat losses and acoustic losses of the resonator 200.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
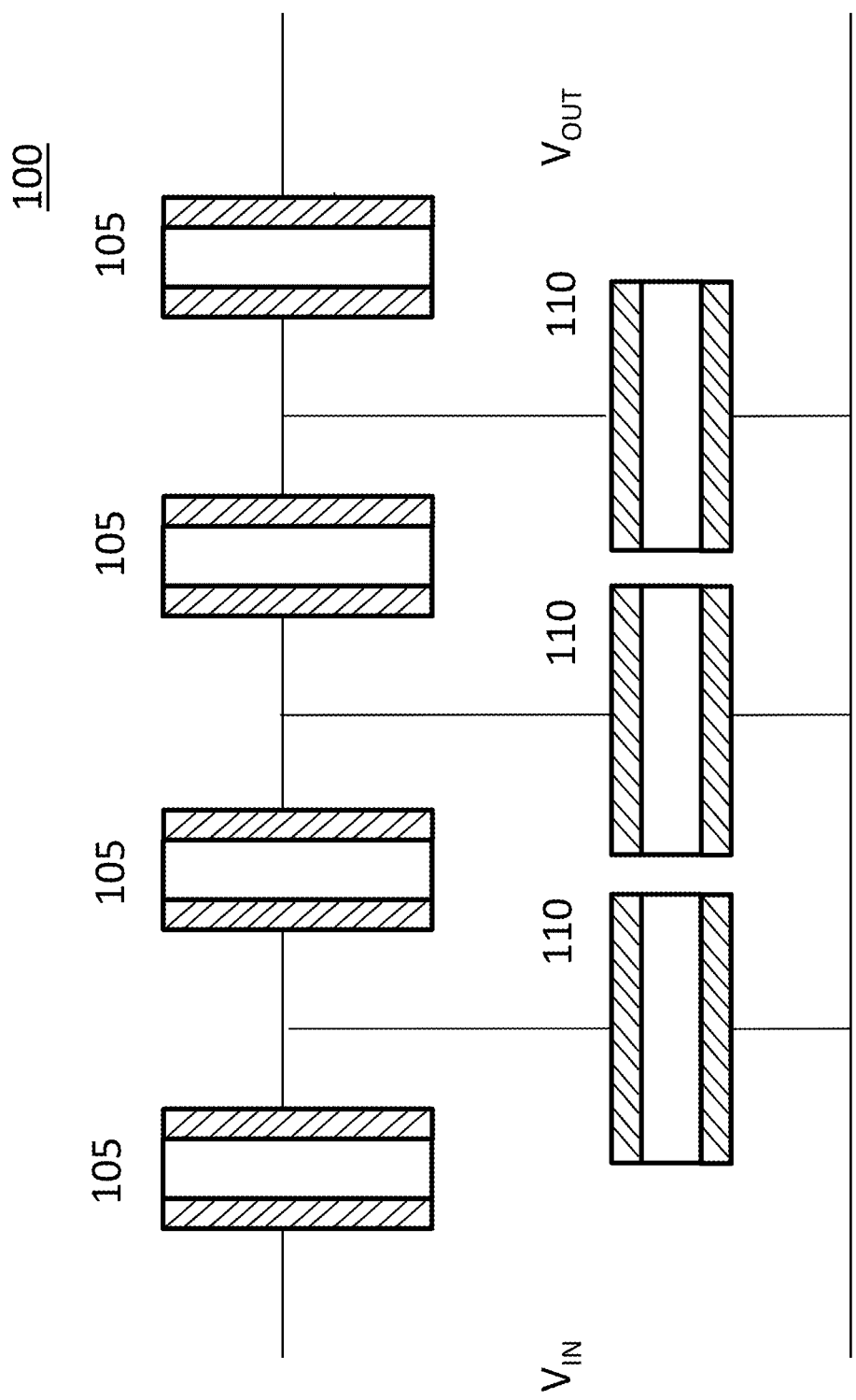
FIG. 1 is a block diagram illustrating a conventional band-pass filter comprising a plurality of acoustic resonators.
Figure 2:
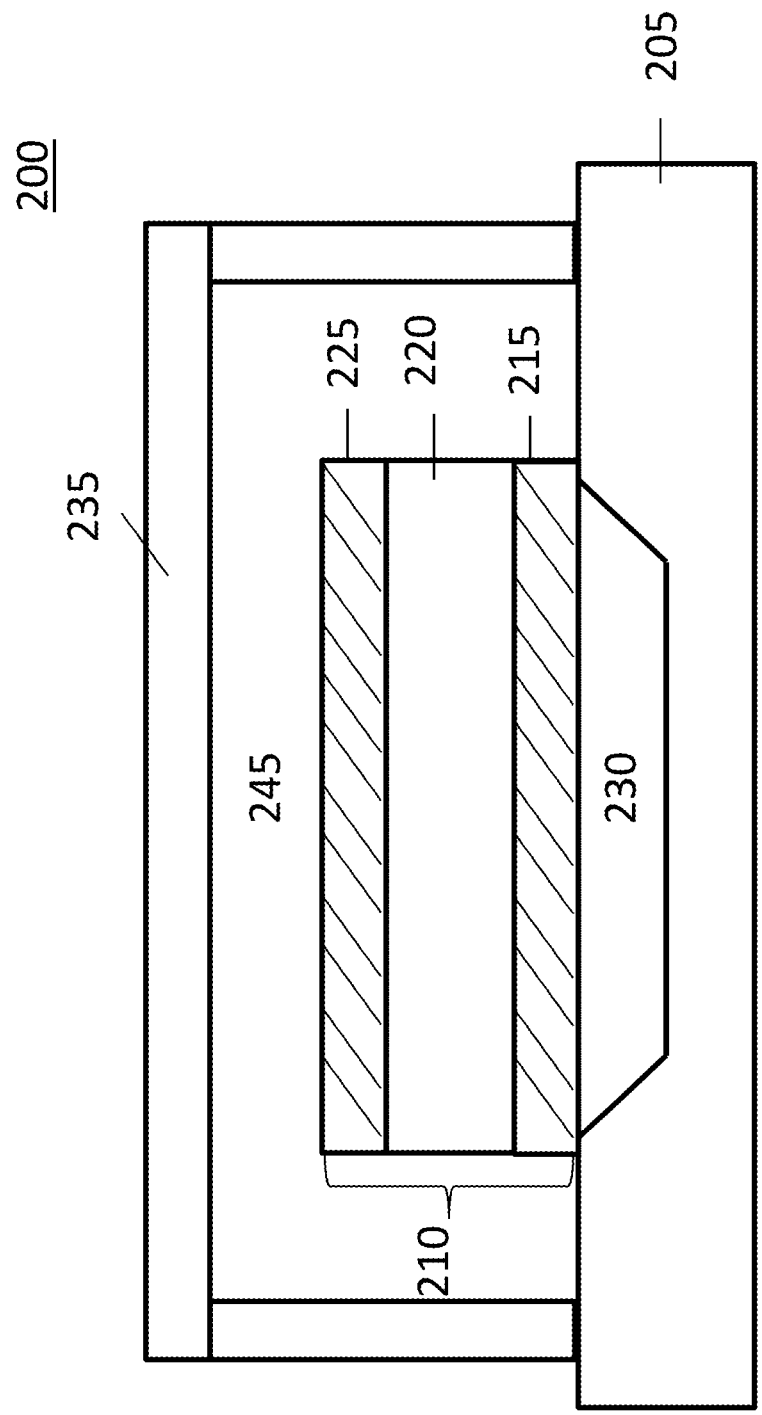
FIG. 2 is a cross-sectional view illustrating a conventional acoustic resonator.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

The present teachings relate generally to BAW resonator structures. The BAW resonator structures useful in the apparatuses of the present teachings comprise BAW resonators, including FBARs or SMRs. When connected in a selected topology, a plurality of the resonators can act as an electrical filter. For example, the acoustic resonators may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers, diplexers, triplexers, quadplexers, quintplexers, etc.

A variety of materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,629,865, 7,714,684 to Ruby et al.; U.S. Pat. Nos. 7,791,434 8,188,810, and 8,230,562 to Fazzio, et al.; U.S. Pat. No. 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. No. 7,561,009 to Larson, et al.; U.S. Patent Application Publication No. 20120326807 to Choy, et al.; U.S. Patent Application Publication No. 20100327994 to Choy, et al.; U.S. Patent Application Publications Nos. 20110180391, 20120177816, 20140132117, 20140246305 to Larson III, et al.; U.S. Patent Application Publication No. 20070205850 to Jamneala et al.; U.S. Patent Application Publications Nos. 20110266925 and 20130015747, to Ruby, et al. U.S. Patent Application Publication Nos. 20140292150 and 20130049545, to Zou, et al.; U.S. patent application Ser. No. 14/161,564 entitled: "Method of Fabricating Rare-Earth Element Doped Piezoelectric Material with Various Amounts of Dopants and a Selected C-Axis Orientation," filed on Jan. 22, 2014 to John L. Larson III; U.S. patent application Ser. No. 13/662,460 entitled "Bulk Acoustic Wave Resonator having Piezoelectric Layer with Multiple Dopants," filed on Oct. 27, 2012 to Choy, et al.; U.S. patent application Ser. No. 13/906,873 entitled "Bulk Acoustic Wave Resonator having Piezoelectric Layer with Varying Amounts of Dopants" to John Choy, et al. and filed on May 31, 2013; and U.S. patent application Ser. No. 14/191,771, entitled "Bulk Acoustic Wave Resonator having Doped Piezoelectric Layer" to Feng, et al. and filed on Feb. 27, 2014. The entire disclosure of each of the patents, published patent applications and patent applications listed above are hereby specifically incorporated by reference herein. It is emphasized that the components, materials and methods of fabrication described in these patents and patent applications are representative and other methods of fabrication and materials within the purview of one of ordinary skill in the art are also contemplated.

In certain embodiments described below, a BAW resonator comprises a bottom electrode formed on a substrate, a piezoelectric layer formed over the bottom electrode, and a top electrode formed over the piezoelectric layer. The piezoelectric layer comprises a thin film of aluminum scandium nitride ($Al_{1-x}Sc_xN$; 0<x<1). The thin film of aluminum scandium nitride is typically formed by a sputtering process using one or more scandium-doped aluminum sputter targets in an atmosphere comprising at least nitrogen gas. In some embodiments, for instance, the targets may comprise 5 to 10 percent scandium atoms ($0.05<x<0.10$), leaving 90 to 95 percent aluminum atoms. Accordingly, the resulting thin film is similar to aluminum nitride (AlN), except that about 5 to 10 percent of the aluminum atoms are replaced with scandium. Alternatively, a higher or lower concentration of scandium atoms could also be used in the sputter target to achieve a corresponding increase or decrease in the scandium concentration of the thin film.

The use of aluminum scandium nitride can improve the piezoelectric coupling coefficient of a BAW resonator, which in turn improves the bandwidth of a filter including the BAW resonator. Alternatively, scaling down the thickness of the piezoelectric layer will reduce the effective coupling and resonator area while improving the Q of the resonator which results in better insertion loss. This helps to reduce the cost of low frequency applications. These improvements can also be useful, for instance, in Universal Mobile Telecommunications System (UMTS) bands 3 and 8, to produce better insertion loss while maintaining high attenuation at high frequencies. The improved insertion loss and attenuation in these bands may be beneficial, due to reduced battery power required for the transmitter filter and better sensitivity in the receiver section due to lower insertion loss in the receive filter. This often means longer battery life and fewer dropped calls in a wireless device.

Figure 3A:
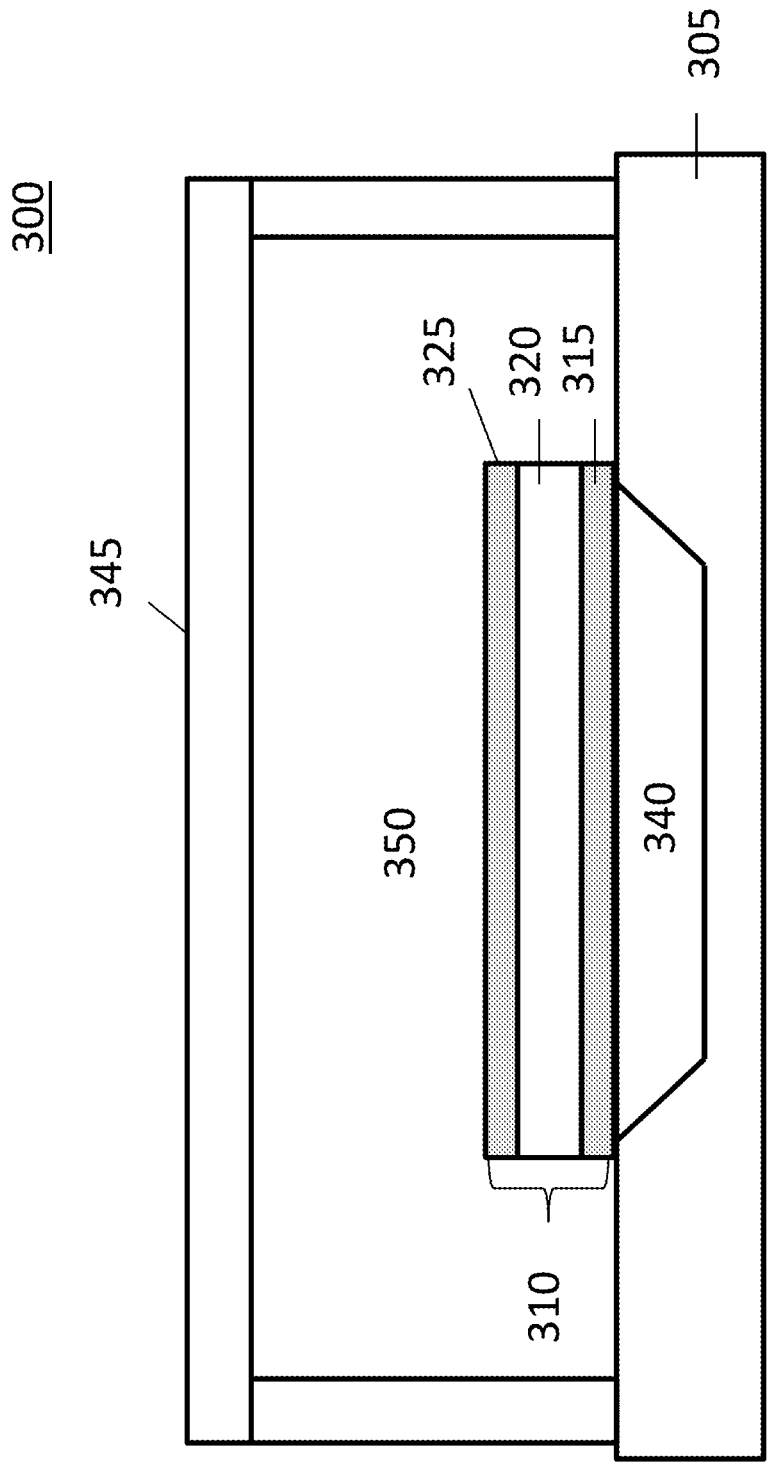
FIG. 3A is a cross-sectional view of an acoustic resonator according to a representative embodiment.
Figure 3B:
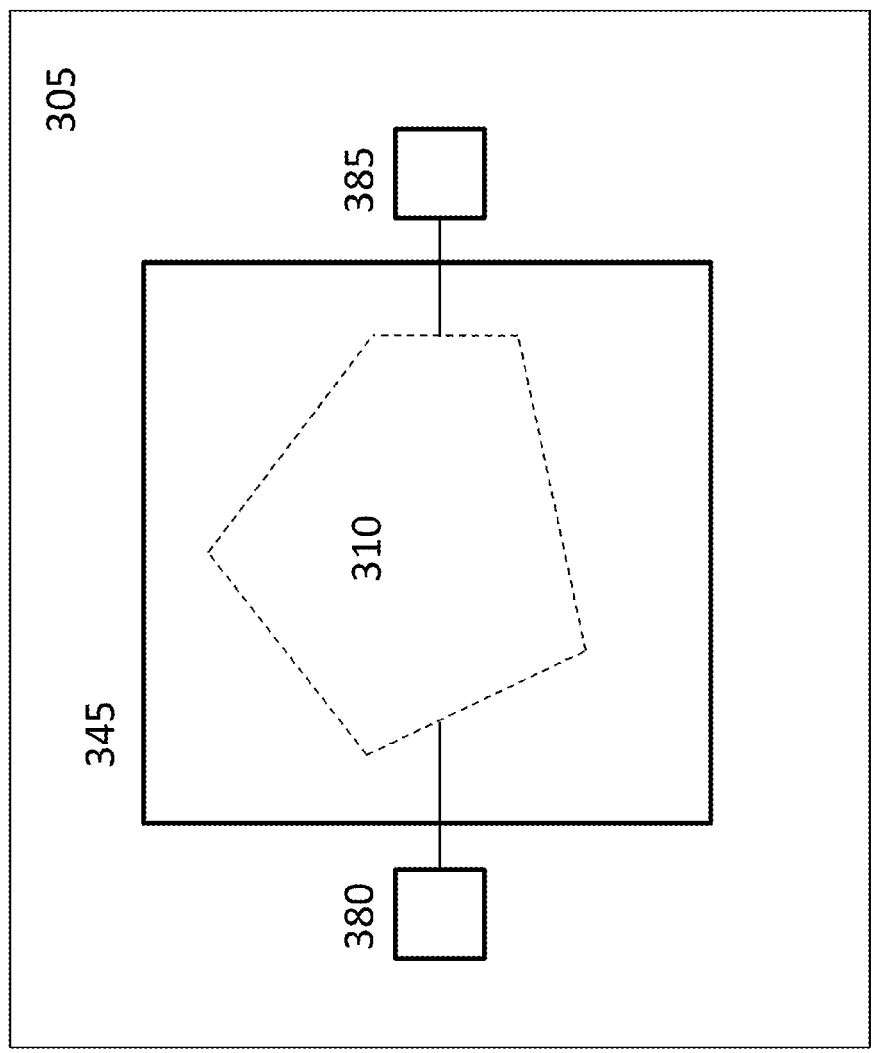
FIG. 3B is a top view of the acoustic resonator of FIG. 3A according to a representative embodiment.

FIG. 3A is a cross-sectional view of an BAW resonator 300 according to a representative embodiment, and FIG. 3B is a top view of BAW resonator 300 in accordance with a representative embodiment. In the illustrated embodiments, BAW resonator 300 comprises a BAW resonator formed with a piezoelectric layer comprising aluminum scandium nitride. As illustrated by FIG. 3B, BAW resonator 300 comprises an acoustic stack having an apodized pentagonal structure, i.e. an asymmetric pentagon to distribute the spurious mode density over frequency and avoid high dissipation at any one frequency.

Referring to FIG. 3A, BAW resonator 300 comprises a substrate 305, an acoustic stack 310, and a microcap 345 separated from the acoustic stack 310 by an air gap 350.

Substrate 305 may comprise various types of semiconductor materials compatible with semiconductor processes, such as silicon (Si), gallium arsenide (GaAs), indium phosphide (InP), or the like, which can be useful for integrating connections and electronics, thus reducing size and cost. An cavity 340 (sometimes referred to as a "swimming pool") is provided in substrate 305 and below acoustic stack 310 to allow free movement of acoustic stack 310 during operation. Cavity 340 is typically formed by etching substrate 305 and depositing a sacrificial layer therein prior to formation of acoustic stack 310, and then removing the sacrificial layer subsequent to the formation of acoustic stack 310. In many representative embodiments, the cavity 340 comprises air (i.e., is unfilled). As an alternative to cavity 340, BAW resonator 300 comprises an acoustic reflector, comprising alternating layers of low acoustic impedance material and high acoustic impedance material, as in a Distributed Bragg Reflector (DBR), known to one of ordinary skill in the art.

Acoustic stack 310 comprises a first electrode 315 (sometimes referred to as lower electrode or bottom electrode), a piezoelectric layer 320 disposed over the first electrode 315, and a second electrode 325 (sometimes referred to as upper electrode or top electrode) disposed over the piezoelectric layer 320.

First and second electrodes 315, 325 can be formed of various conductive materials, such as metals compatible with semiconductor processes, including tungsten (W), molybdenum (Mo), aluminum (Al), platinum (Pt), ruthenium (Ru), niobium (Nb), or hafnium (Hf), for example. First and second electrodes 315, 325 can also be formed with conductive sub-layers or in combination with other types of layers, such as temperature compensating layers, for example as described in above-referenced U.S. Patent Application Publications 20130015747 and 20130049545, just by way of example. In addition, first and second electrodes 315, 325 can be formed of the same material, or they can be formed of different materials. Furthermore, second electrode 325 may comprise a bridge or a cantilevered portion, such as described in above-referenced U.S. Pat. Nos. 8,248,185, and 8,902,023.

Notably, second electrode 325 can further comprise a passivation layer disposed thereover (not shown), which can be formed of various types of materials, including AlN, silicon carbide (SiC), BSG, $SiO_2$, SiN, polysilicon, and the like. The thickness of the passivation layer should generally be sufficient to protect the layers of acoustic stack 310 from chemical reactions with the substances that may enter through a leak in the package.

First and second electrodes 315, 325 are electrically connected to external circuitry via corresponding contact pads 380, 385 shown in FIG. 3B. The contact pads 380, 385 are typically formed of a conductive material, such as gold or gold-tin alloy. Although not shown in FIG. 3A, the connections between the first and second electrodes 315, 325 and the corresponding contact pads extend laterally outward from acoustic stack 310. The connections typically pass through or under the sides of microcap 345. The connections are generally formed of a suitable conductive material, such as Ti/W/gold.

Piezoelectric layer 320 comprises a thin film piezoelectric comprising $Al_{1-x}Sc_xN$. In some embodiments, piezoelectric layer 320 are formed on a seed layer (not shown) disposed over respective upper surfaces of first and second electrodes 315 and 325. The seed layer may comprise Al, for instance, to foster growth of $Al_{1-x}Sc_xN$. Further details of such a method are described, for example, in above-referenced U.S. Patent Application Publications 20140132117, 20140246305 to Larson III, et al.

In certain alternative embodiments, one of the piezoelectric layers could be formed of a different piezoelectric material such as pure AlN, zinc oxide (ZnO), lead zirconium titanate (PZT), gallium nitride (GaN), indium phosphide (InP), or gallium phosphide (GaP), for example. Additionally, one of the piezoelectric layers could be formed by modifying one of the above piezoelectric materials to further include certain types of rare earth metals, such as lanthanum or various lanthanum compounds such as $La_3Ga_5SiO_{14}$, and erbium.

As indicated above, the use of $Al_{1-x}Sc_xN$ in this manner allows BAW resonator 300 to achieve the benefits typically associated with an BAW resonator while avoiding or compensating for the corresponding drawbacks, such as decreased piezoelectric coupling coefficient and Q factor, and increased insertion loss, and an unacceptably thick piezoelectric layer. Due to these combined benefits, BAW resonator 300 may be suitable for applications requiring relatively low cost, such as low frequency filters. For instance, in some embodiments BAW resonator 300 may be designed with a passband having a center frequency below 1 GHz, e.g., between approximately 700 to 900 MHz.

Piezoelectric layer 320 is typically formed by a sputtering process using one or more scandium-doped aluminum sputtering targets in an atmosphere comprising at least nitrogen gas, typically in combination with one or more inert gases such as argon. The sputtering targets are typically doped with a percentage of scandium atoms corresponding to a desired composition of piezoelectric layer 320. For instance, in some embodiments, a sputtering target may be doped with approximately 5 to 10 percent scandium atoms to produce a piezoelectric layer of $Al_{1-x}Sc_xN$ where x is between approximately 0.05 and 0.10. Again, further details of sputtering from a target are found, for example, in U.S. Patent Application Publication Nos. 20140132117, 20140246305 to Larson III, et al.

In a BAW resonator for a ladder filter having a passband at approximately 900 MHz, if piezoelectric layer 320 have a thickness of approximately 1 microns (μm), a typical resonator area of the BAW resonator may be about 40,000 square microns. A typical ladder filter would have eight resonators (although this number can vary) and the die area would be about twice this, or 0.5 square millimeters. Without scandium doping, the thicknesses of piezoelectric layer 320 would have to be approximately 2 microns in order to achieve similar electrical performance, but such an increase in thickness would increase die area and cost by at least 33 percent.

In general, there is not a fixed range of thicknesses or frequencies for the piezoelectric layers of a BAW resonator comprising aluminum scandium nitride because different filters may require different bandwidths and use different thicknesses. Nevertheless, in an example implementation, a 700-900 MHz filter may require piezoelectric layer 320 to be formed of AlN with thickness of approximately 1.4 μm to approximately 3.0 μm to achieve adequate bandwidth. The improved $k_t^2$ provided by the aluminum scandium nitride may allow these layers to be formed approximately 30%-50% thinner, when using about 5-10% scandium, while allowing the BAW resonator to have substantially the same frequency and electrical signature. Accordingly, a 700-900 MHz filter may allow piezoelectric layer 320 to be formed of aluminum scandium nitride with a smaller thickness of approximately 1.0 μm to approximately 2.1 μm while achieving adequate bandwidth. This reduction in thickness can shrink both the size of a resonator and a corresponding die.

The approximate 30%-50% reduction in the above thicknesses realized by the aluminum scandium nitride piezoelectric layer of the present teachings (compared to AlN) may be justified in light of various considerations, such as the following. First, the use of aluminum scandium nitride increases the value of $k_t^2$ for the piezoelectric layers, as indicated above. This allows the BAW resonator to be designed with a smaller thickness proportional to example data shown in FIG. 5, described below. Second, the aluminum scandium nitride tends to reduce acoustic velocity, which allows a scaling down in thickness of all resonator layers to get back to the same frequency (and concurrent resonator area reduction). Third, the aluminum scandium nitride tends to have a higher dielectric constant, allowing further resonator area reduction for the same total impedance. Fourth, proportionally thicker electrodes tend to provide improved Q-factor, which tends to reduce insertion loss. This can be used for better performance or scaling down the effective $k_t^2$ by thinning the piezoelectric layers even further for additional die shrinking. Notably, the approximate 30%-50% thickness reduction is based on the use of approximately 5% to approximately 10% scandium, and different improvements can be achieved by using other amounts of scandium.

Microcap 345 is formed over the top of acoustic stack 310 to form an air gap 350. Air gap 350 provides acoustic isolation between acoustic stack 310 and surrounding structures, and microcap 345 protects BAW resonator 300 against damage from environmental factors such as humidity, debris, and so on. In certain embodiments, microcap 345 is formed by etching a cavity in a silicon wafer and then performing a wafer bonding process to connect it to substrate 305. In other embodiments, microcap 345 is formed by attaching an annular gasket to substrate 305 and then covering the gasket with a silicon wafer. As a potential alternative to microcap 345, a molding material such as polyimide, room-temperature vulcanizing rubber (RTV), or glass-loaded epoxy could be used to cover the structures of BAW resonator 300.

FIG. 3B shows contact pads 380, 385 connected to respective first and second electrodes 315, 325 of acoustic stack 310. These contacts pads are located on substrate 305 outside of microcap 345, and they are used to connect BAW resonator 300 with external circuitry. In a filter such as that illustrated in FIG. 1, signal pads are typically formed in only two of the seven acoustic resonators while multiple ground pads connect to the shunt resonators. In particular, connection pads are formed near the acoustic resonator connected to any external terminal. The other acoustic resonators can be connected to each other by internal connections without the use of contact pads.

During typical operation of BAW resonator 300, contact pad 380 is connected at one voltage, and contact pad 385 is connected to a different voltage from contact pad 380. In one example, contact pad 380 is connected to a common reference voltage such as ground, while contact pad 385 is connected to an input signal. Alternatively, contact pad 385 can be connected to ground while contact pad 380 is connected to an input signal.

Figure 4:
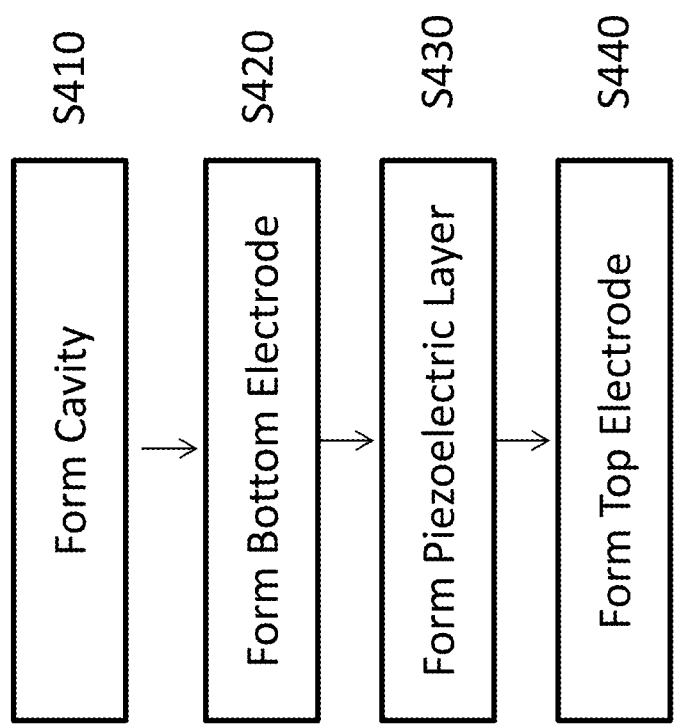
FIG. 4 is a flowchart illustrating a method of manufacturing an acoustic resonator according to a representative embodiment.

FIG. 4 is a flowchart illustrating a method of manufacturing an BAW resonator according to a representative embodiment. For convenience of explanation, the method of FIG. 4 will be described with reference to BAW resonator 300 of FIG. 3. However, the method is not limited to forming an BAW resonator with the illustrated configuration. In the description that follows, example method steps are indicated by parentheses.

Referring to FIG. 4, the method begins by etching substrate 305 to form cavity 340 (S410). In a typical example, substrate 305 comprises silicon, and cavity 340 is formed by conventional etching technologies. A sacrificial layer is typically formed in cavity 340 prior to the formation of acoustic stack 310 and removed subsequent to formation of acoustic stack 310. After the sacrificial layer is formed in cavity 340, lower electrode 315 is formed over substrate 305 (S420). Lower electrode 315 can be formed by a known deposition technique using materials such as those indicated above in relation to FIG. 3.

Next, piezoelectric layer 320 is formed on lower electrode 315 by a sputtering process using a scandium-doped aluminum sputtering target (S430). As indicated in the description of FIG. 3, the sputtering target may comprise, for instance, 5 to 10 percent scandium atoms in order to form piezoelectric layer 320 with a similar proportion of scandium and aluminum atoms. After lower electrode 315 and piezoelectric layer 320 are formed, top electrode 325 is formed (S440). In general, top electrode 325 can be formed of the same or a different material and/or by the same or a different process compared to bottom and top electrodes 315 and 335. As will be apparent to those skilled in the art, additional processing steps may be performed subsequent to the formation of top electrode 325, such as the formation of a passivation layer, electrodes, a cap, for example. Moreover, as will also be apparent to those skilled in the art, additional processing steps can be performed between or during the other operations illustrated in FIG. 4.

Figure 5:
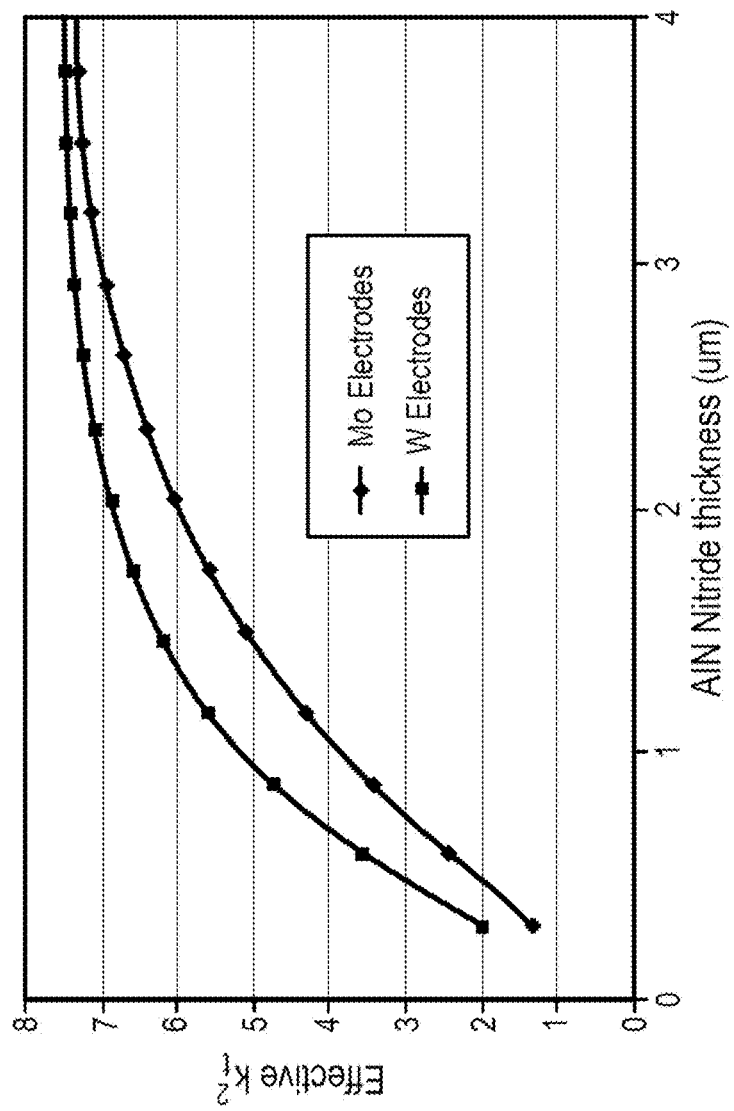
FIG. 5 is a graph illustrating a general relationship between the thickness of an aluminum nitride layer and its electromechanical coupling coefficient $k_t^2$ in an acoustic resonator designed to operate at 850 MHz.

FIG. 5 is a graph illustrating a general relationship between the thickness of an aluminum nitride layer and its effective electromechanical coupling coefficient $k_t^2$ in an acoustic resonator. This effective coupling is the product of the intrinsic material coupling coefficient times a geometrical scale factor depending on the dielectric constants, densities, velocities of sound, and thicknesses of the layers comprising the resonator. The filter bandwidth achievable is proportional to the effective electromechanical coupling coefficient $k_t^2$. Where the aluminum nitride layer further comprises scandium as in the above-described embodiments, the illustrated values of $k_t^2$ will be multiplied by a corresponding improvement value conferred by the scandium. For 5% concentrations of scandium, this improvement value will be about 1-2%. Accordingly, the electromechanical coupling coefficient $k_t^2$ can vary as a function of both the thickness of the aluminum nitride layer as well as any improvement conferred by scandium.

The graph shows values of $k_t^2$ for an BAW resonator having electrodes made of W and Mo, which have different acoustic impedances. As illustrated by the graph, the use of different electrode materials can also affect the value of $k_t^2$, with W providing a higher value than Mo. Accordingly, W may be used to provide improved $k_t^2$ and/or reduced resonator area in certain applications, such as low-frequency (e.g., 850 MHz) duplexers.

As illustrated in FIG. 5, the electromechanical coupling coefficient $k_t^2$ tends to increase up to a point with the thickness of the aluminum nitride layer. It also tends to increase with the use of scandium. Because $k_t^2$ is increased by both of these factors, a relatively thin $Al_{1-x}Sc_xN$ may achieve substantially the same electrical performance as a thicker AlN layer, but with smaller size, lower parasitic electrode resistance, and possibly, higher Q. Accordingly, the use of $Al_{1-x}Sc_xN$ in a FBAR may allow various cost and performance tradeoffs.

While example embodiments are disclosed herein, those skilled in the art will appreciate that many variations that are in accordance with the present teachings are possible and remain within the scope of the appended claims. For instance, as indicated above, the location, dimensions, and materials of the described BAW resonator features can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
   a first electrode disposed over a substrate;
   an air cavity located in the substrate and below the first electrode;
   a piezoelectric layer disposed over the first electrode and comprising aluminum scandium nitride, the piezoelectric layer having a thickness in a range of approximately 1.0 μm to approximately 1.5 μm; and
   a second electrode disposed over the piezoelectric layer, wherein the BAW resonator structure has an electrical impedance, and an area, and the area is less than an area of a comparable BAW resonator structure comprising identical layers and materials except for comprising an undoped aluminum nitride piezoelectric layer, and having the same electrical impedance.

2. The BAW resonator structure of claim 1, wherein the BAW resonator structure has a passband with a center frequency in a range of approximately 700 MHz to approximately 900 MHz.

3. The BAW resonator structure of claim 1, wherein the aluminum scandium nitride has a scandium concentration between approximately zero percent by number of atoms and 50 percent by number of atoms.

4. The BAW resonator structure of claim 1, wherein the aluminum scandium nitride has a scandium concentration of approximately 5 percent by number of atoms to approximately 10 percent by number of atoms.

5. A bulk acoustic wave (BAW) resonator structure, comprising:
   a first electrode disposed over a substrate;
   an air cavity located in the substrate and below the first electrode;
   a piezoelectric layer disposed over the first electrode and comprising aluminum scandium nitride, wherein the BAW resonator structure has a passband with a center frequency between approximately 700 MHz and approximately 900 MHz; and
   a second electrode disposed over the piezoelectric layer, wherein the BAW resonator structure has an electrical impedance, and an area, and the area is less than an area of a comparable BAW resonator structure comprising identical layers and materials except for comprising an undoped aluminum nitride piezoelectric layer, and having the same electrical impedance.

6. The BAW resonator structure of claim 5, wherein the first and second electrodes each comprise tungsten.

7. The BAW resonator structure of claim 5, wherein the piezoelectric layer has a thickness in a range of approximately 1.0 μm to approximately 1.5 μm.

8. The BAW resonator structure of claim 5, wherein the aluminum scandium nitride has a scandium concentration of approximately 5 percent by number of atoms to approximately 10 percent by number of atoms.

9. The BAW resonator structure of claim 5, wherein the aluminum scandium nitride has a scandium concentration of approximately 0 percent by number of atoms to approximately 50 percent by number of atoms.

10. A ladder filter comprising a plurality of series resonators and a plurality of shunt resonators connected between an input port and an output port, at least one of the series resonators, or shunt resonators comprising a bulk acoustic wave (BAW) resonator structure, comprising:
    a first electrode disposed over a substrate;
    an air cavity located in the substrate and below the first electrode;
    a piezoelectric layer disposed over the first electrode and comprising aluminum scandium nitride, the piezoelectric layer having a thickness in a range of approximately 1.0 microns to approximately 1.5 microns; and
    a second electrode disposed over the piezoelectric layer, wherein the BAW resonator structure has an electrical impedance, and an area, and the area is less than an area of a comparable BAW resonator structure comprising identical layers and materials except for an undoped aluminum nitride piezoelectric layer, and having the same electrical impedance.

11. The ladder filter of claim 10, wherein the aluminum scandium nitride has a scandium concentration between approximately 0 percent and approximately 50 percent by number of atoms.

12. The ladder filter of claim 10, wherein the aluminum scandium nitride has a scandium concentration of approximately 5 percent by number of atoms to approximately 10 percent by number of atoms.

13. A ladder filter comprising a plurality of series resonators and a plurality of shunt resonators connected between an input port and an output port, at least one of the series resonators, or shunt resonators comprising a bulk acoustic wave (BAW) resonator structure, comprising:
   a first electrode disposed over a substrate;
   an air cavity located in the substrate and below the first electrode;
   a piezoelectric layer disposed over the first electrode and comprising aluminum scandium nitride, the piezoelectric layer having a thickness in a range of approximately 1.0 microns to approximately 1.5 microns; and
   a second electrode disposed over the piezoelectric layer, wherein the ladder filter has a passband with a center frequency in a range of approximately 700 MHz to approximately 900 MHz.

14. The ladder filter of claim 13, wherein the aluminum scandium nitride has a scandium concentration between approximately 0 percent and approximately 50 percent by number of atoms.

15. The ladder filter of claim 13, wherein the aluminum scandium nitride has a scandium concentration of approximately 5 percent by number of atoms to approximately 10 percent by number of atoms.

16. The ladder filter of claim 13, wherein the aluminum scandium nitride has a scandium concentration of approximately 5 percent by number of atoms to approximately 10 percent by number of atoms.

17. The ladder filter of claim 13, wherein the first and second electrodes each comprise tungsten.

* * * * *